(12) United States Patent
Burlison et al.

(10) Patent No.: US 7,865,788 B2
(45) Date of Patent: Jan. 4, 2011

(54) DYNAMIC MASK MEMORY FOR SERIAL SCAN TESTING

(75) Inventors: Phillip D. Burlison, Morgan Hill, CA (US); Mei-Mei Su, Mountain View, CA (US); John K. Frediani, Corralitos, CA (US)

(73) Assignee: Verigy (Singapore) Pte. Ltd., Singapore (SG)

( * ) Notice: Subject to any disclaimer, the term of this patent is extended or adjusted under 35 U.S.C. 154(b) by 427 days.

(21) Appl. No.: 11/941,026

(22) Filed: Nov. 15, 2007

(65) Prior Publication Data

US 2009/0132870 A1    May 21, 2009

(51) Int. Cl.
G11C 29/00 (2006.01)

(52) U.S. Cl. ....................................................... 714/723

(58) Field of Classification Search ................. 714/723, 714/724, 763
See application file for complete search history.

(56) References Cited

U.S. PATENT DOCUMENTS

| | | | | |
|---|---|---|---|---|
| 5,956,352 | A * | 9/1999 | Tatosian et al. | 714/773 |
| 7,257,750 | B1 * | 8/2007 | Singh et al. | 714/732 |
| 7,437,624 | B2 * | 10/2008 | Miller et al. | 714/700 |
| 7,584,386 | B2 * | 9/2009 | Bancel et al. | 714/45 |
| 7,620,876 | B2 * | 11/2009 | Lewis et al. | 714/763 |
| 2007/0288821 | A1 * | 12/2007 | Matsuo et al. | 714/728 |

* cited by examiner

*Primary Examiner*—James C Kerveros
(74) *Attorney, Agent, or Firm*—Holland & Hart, LLP

(57) ABSTRACT

A failure mask memory is added to a semiconductor tester. In conjunction with a new failure filter, failures may be ignored or used to update the contents of failure mask memory. Only the first instance of a failure is reported reducing the size of test data logs.

7 Claims, 10 Drawing Sheets

Figure 5 – Invention Timing Diagram

Figure 6– "Capture Fails Only" Capture Memory Implementation with Hold-Off Counter

|       |       | Pins |   |   |   |   |   |   |   |   |    |    |    |    |    |    |    |
|-------|-------|---|---|---|---|---|---|---|---|---|----|----|----|----|----|----|----|
| Cycle |       | 1 | 2 | 3 | 4 | 5 | 6 | 7 | 8 | 9 | 10 | 11 | 12 | 13 | 14 | 15 | 16 |
| 0     | 3     | P | P | P | F | P | P | P | P | P | P  | P  | P  | P  | P  | P  | P  |
| 1     | 5     | P | P | F | P | P | F | P | P | P | P  | P  | P  | P  | P  | P  | P  |
| 2     | 6     | P | P | P | P | P | P | F | P | P | P  | P  | P  | P  | P  | P  | P  |
| 3     | 956   | P | P | P | P | F | P | F | P | P | P  | P  | P  | P  | P  | P  | P  |
| 4     | 2088  | P | F | F | P | P | P | F | P | P | P  | P  | P  | P  | P  | P  | P  |
| 5     | 2089  | P | P | P | P | P | P | P | P | F | P  | P  | P  | P  | P  | P  | P  |
| 6     | 8186  | P | P | P | P | F | P | P | P | P | P  | P  | P  | P  | P  | P  | P  |
| 7     | 8187  | P | P | F | P | F | P | P | P | P | P  | P  | P  | P  | P  | P  | P  |
| 8     | 8190  | P | P | P | P | P | P | P | P | P | P  | P  | F  | P  | P  | P  |    |
| 9     | -     | - | - | - | - | - | - | - | - | - | -  | -  | -  | -  | -  | -  | -  |
| 10    | -     | - | - | - | - | - | - | - | - | - | -  | -  | -  | -  | -  | -  | -  |
| 11    | -     | - | - | - | - | - | - | - | - | - | -  | -  | -  | -  | -  | -  | -  |
| 12    | -     | - | - | - | - | - | - | - | - | - | -  | -  | -  | -  | -  | -  | -  |
| 13    | -     | - | - | - | - | - | - | - | - | - | -  | -  | -  | -  | -  | -  | -  |
| 14    | -     | - | - | - | - | - | - | - | - | - | -  | -  | -  | -  | -  | -  | -  |
| 15    |       |   |   |   |   |   |   |   |   |   |    |    |    |    |    |    |    |

Figure 7

|  | Test Frequency Applied | # of Failing flipflops | Failures logged without Invention | Failures logged with Invention |
|---|---|---|---|---|
| Pass 1: | 100MHz | 0 | 0 | 0 |
| Pass 2: | 110MHz | 15,000 | 18,750,000 | 15,000 |
| Pass 3: | 120MHz | 25,000 | 31,250,000 | 10,000 |
| Pass 4: | 130MHz | 50,000 | 62,500,000 | 25,000 |
| Pass 5: | 140MHz | 75,000 | 93,750,000 | 25,000 |
| Pass 6: | 150MHz | 100,000 | 125,000,000 | 25,000 |
| Total Logged Faiures | | | 331,000,000 | 100,000 |

FIG.8

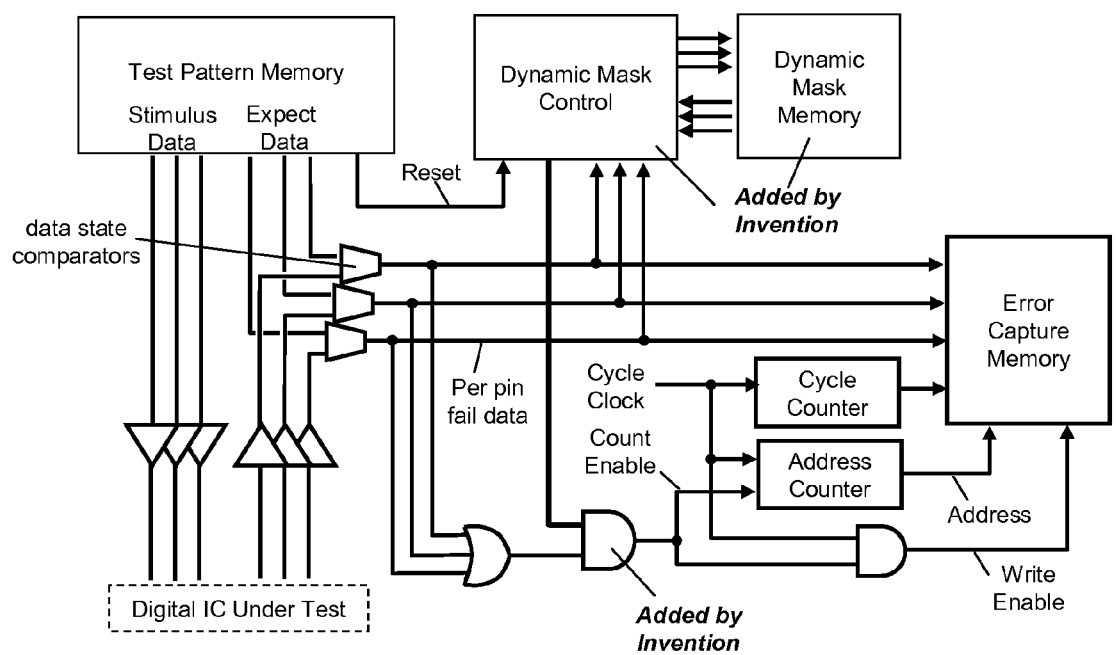
Figure 9 – Invention integrated into a "Capture Fails Only" Capture Memory Implementation

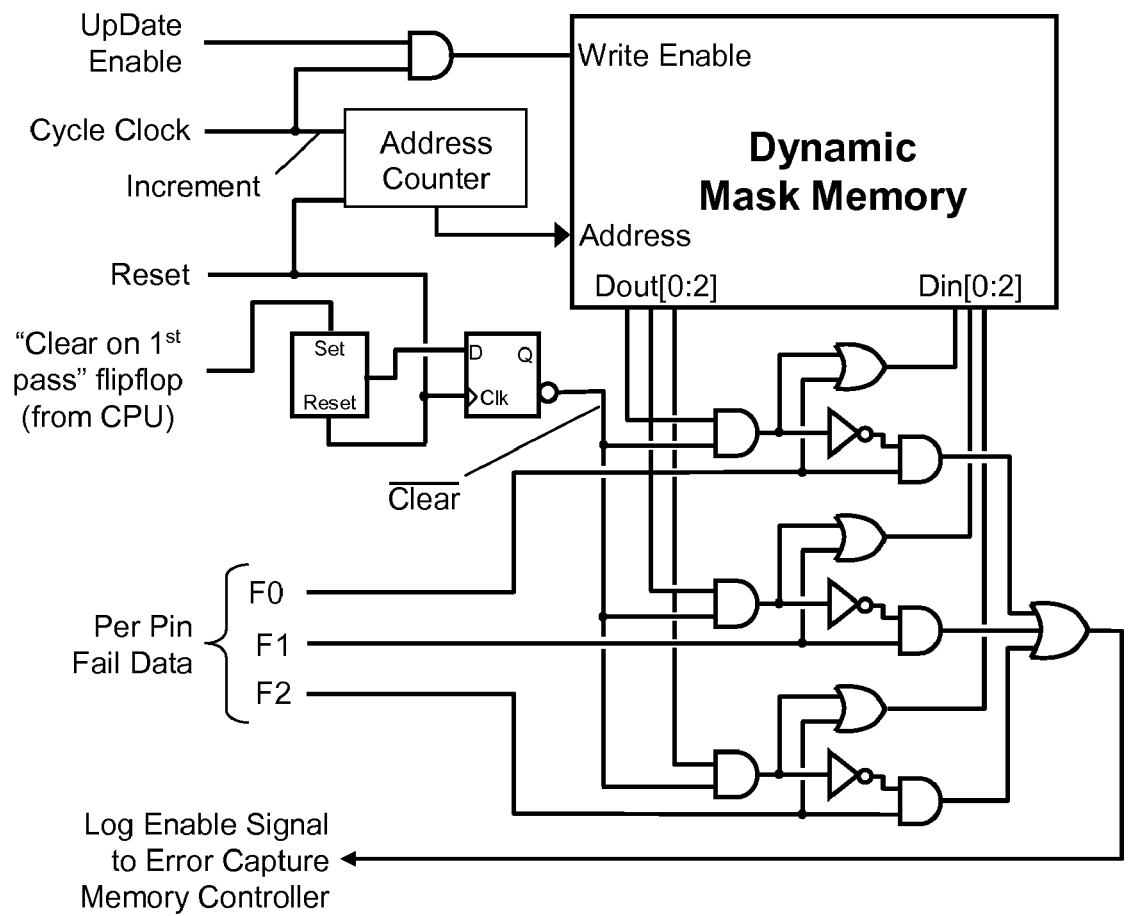
Figure 10 – One Implementation of the Invention

DYNAMIC MASK MEMORY FOR SERIAL SCAN TESTING

BACKGROUND

Scan test pattern sets typically consist of several thousand individual "load/unload" patterns, where each pattern consists of serially inputting a unique test stimulus data state into each flipflop in the IC.

It is often the case that test engineers program Automatic Test Equipment (ATE) to record each failure in a test pattern set to determine which flipflop and which pattern the failure was observed on. This data can be used by subsequent offline analysis tools.

As an example consider the case:
2,000 flipflops in a scan chain
10,000 patterns applied
A single fault exists in the IC which may affect 4 flipflops (depending on the pattern)
Total # of vectors applied in the test pattern set=20,000,000.
Number of failing vectors=12,000 (0.30% of patterns×4 flip-flops)

This number increases proportionally with the # of faults in an IC.

Most semiconductor IC testers may have an "Error Capture Memory" of a specific capacity. The size of this memory can vary significantly with different tester models (e.g. 1,024 locations to 32 million locations)

In a conventional tester, as illustrated in FIG. 6, data is written into a memory location only when a failing cycle is detected. This requires that a cycle number be also recorded into the memory along with the pin Pass/Fail data as can be observed in FIG. 7.

If the memory is not large enough to accommodate all the failures that occur in a single pattern set, the test pattern set may be repeated several times with the memory reconfigured to capture a different sequence of failing vectors each pass. One method for doing this is to have a "hold-off" counter which can be initialized to ignore the first "n" failing cycles.

Transferring the error capture memory contents back to the tester CPU, and subsequently into a disc file for off-line analysis, is a time consuming task which can have a negative impact on throughput in a semiconductor manufacturing test environment Furthermore, it may be wasteful because there are applications in which it is only useful to determine which flipflops failed and unnecessary to know the individual pattern which detected a failure.

There are certain applications in which it is only desired to determine which "additional" flipflops failed in a specific pattern set execution while ignoring flipflops that failed in any previously executed test pattern sets.

There are applications in which the number of failures recorded in a single test pattern set is too large to be handled by conventional testers. One example of these applications is a "frequency" search which is intended to determine the maximum passing frequency of each flipflop. This is accomplished by repetitive re-executions of a scan test pattern set while incrementing the test frequency at each step and recording at what frequency each flipflop first fails at. The table in FIG. 8 exemplifies the benefit this invention provides by comparing the amount of data that must be logged, retrieved from error capture memory, and processed by software to accomplish this process in a conventional tester and in a tester equipped with the present invention.

Test Case: A flipflop fails 25% of the patterns when above its maximum frequency.
100,000 total scan cells (50 chains of 2,000 scan cells each)
5,000 scan load/unload patterns Thus it can be appreciated that what is needed is an apparatus which can efficiently compress failure data logs on a tester to reduce the storage and data transfer for test pattern failures.

BRIEF DESCRIPTION OF DRAWINGS

FIG. 7 is resultant error capture memory map.
FIG. 8 is a table
FIG. 9 is a schematic of the invention integrated into a tester.
FIG. 10 is a schematic of an embodiment.

DETAILED DISCLOSURE

Figure 1:
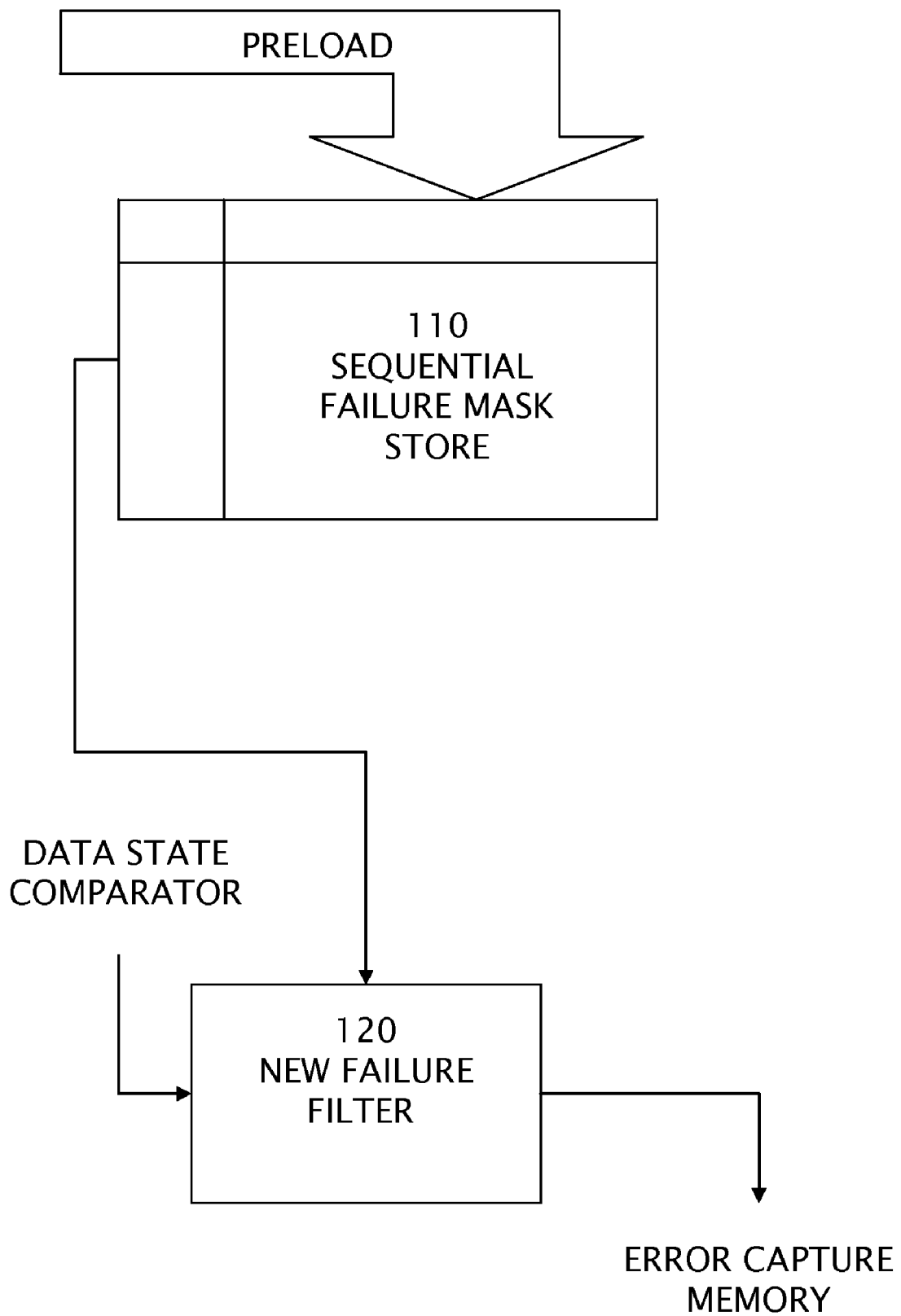
FIGS. 1-4 are block diagrams.

The present invention illustrated in FIG. 1 is an apparatus comprising a sequential failure mask store 110 coupled to a new failure filter 120, wherein the new failure filter receives a data stream emitted from a data state comparator and a failure mask data stream, and transmits an error capture memory input datastream, the error capture memory input datastream providing an input to the sequential failure mask store. The invention further comprises an input to the sequential failure mask store to load the contents with a saved failure mask data stream prior to the execution of the test pattern set.

Figure 2:
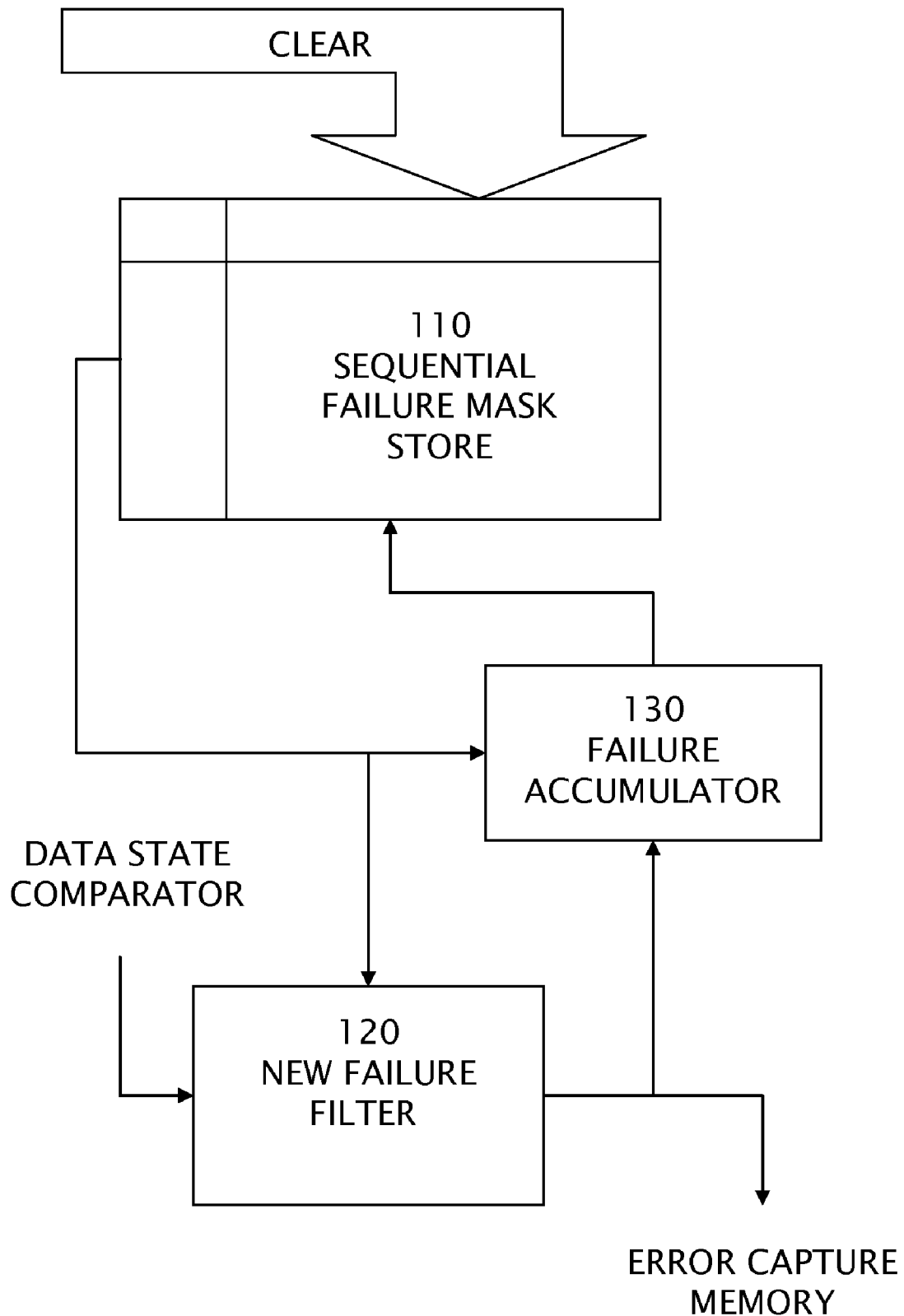

An embodiment of the present invention shown in FIG. 2 is an apparatus comprising a sequential failure mask store 110 coupled to a new failure filter 120, wherein the new failure filter receives a data stream emitted from a data state comparator, and a failure mask data stream and transmits an error capture memory input datastream, the an error capture memory input datastream providing an input to a failure accumulator 130 wherein the failure accumulator is coupled to the sequential failure mask store receiving first failure mask data stream and transmitting a second failure mask data stream.

Figure 3:
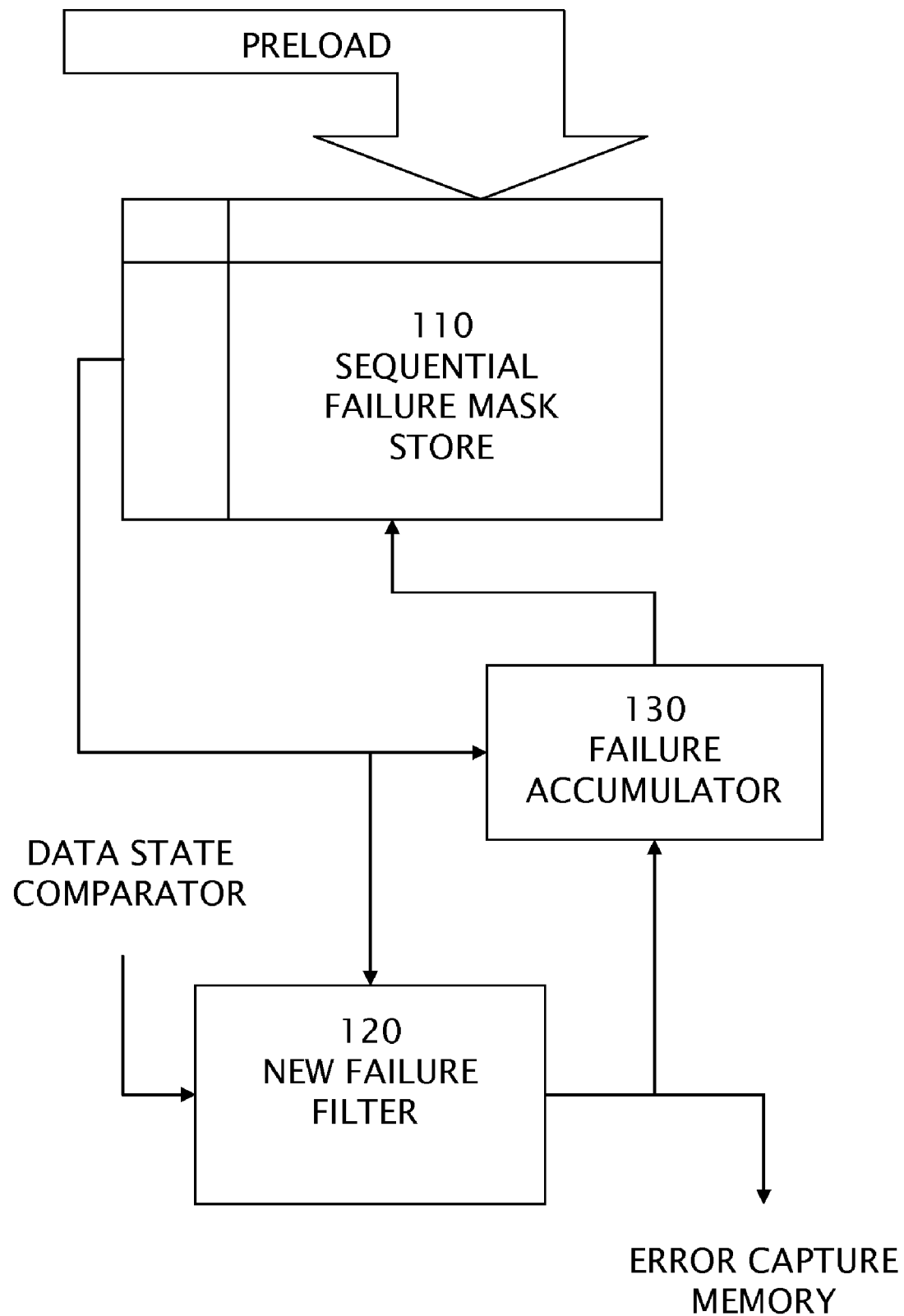
Figure 4:
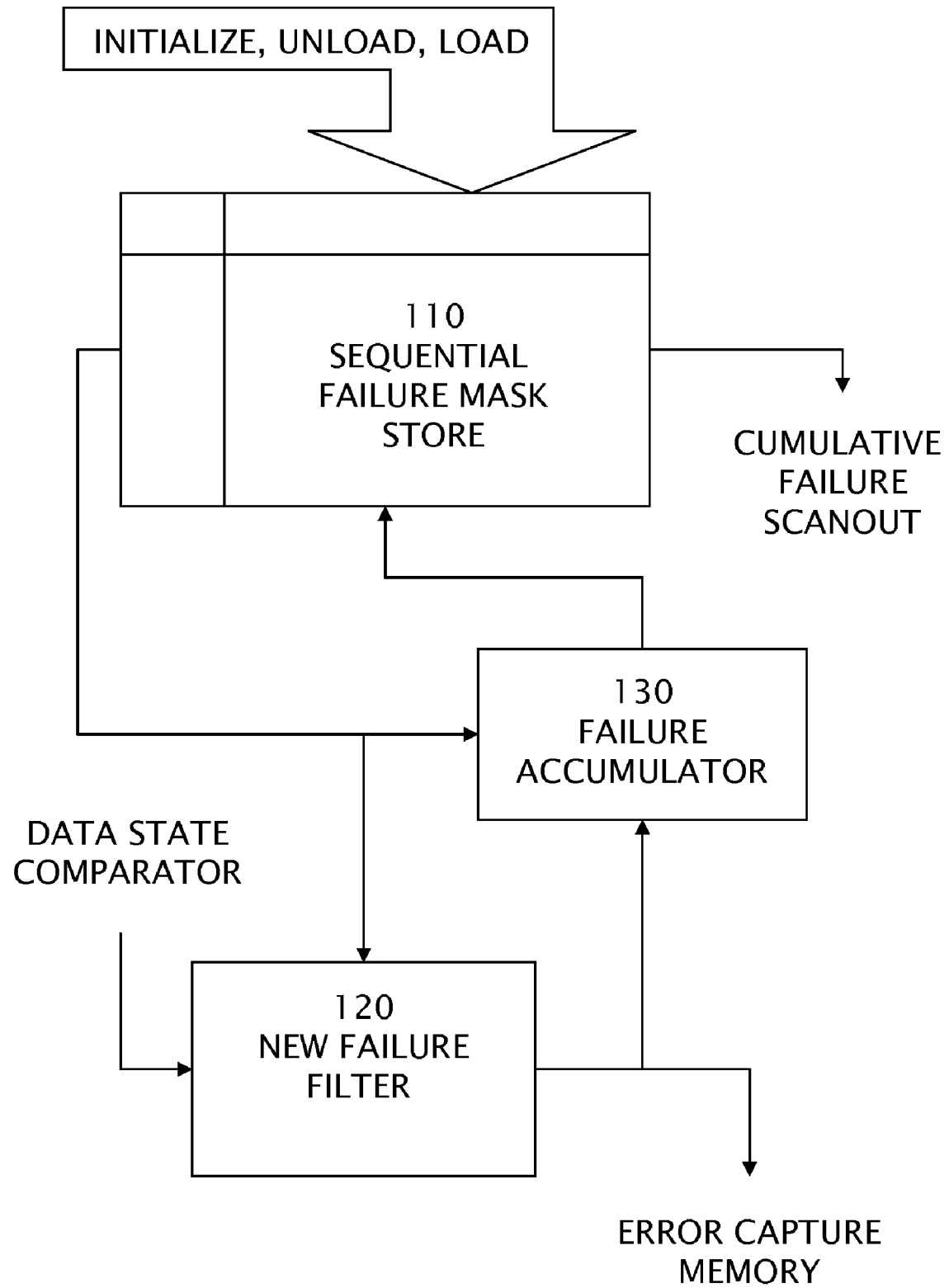
Figure 5:
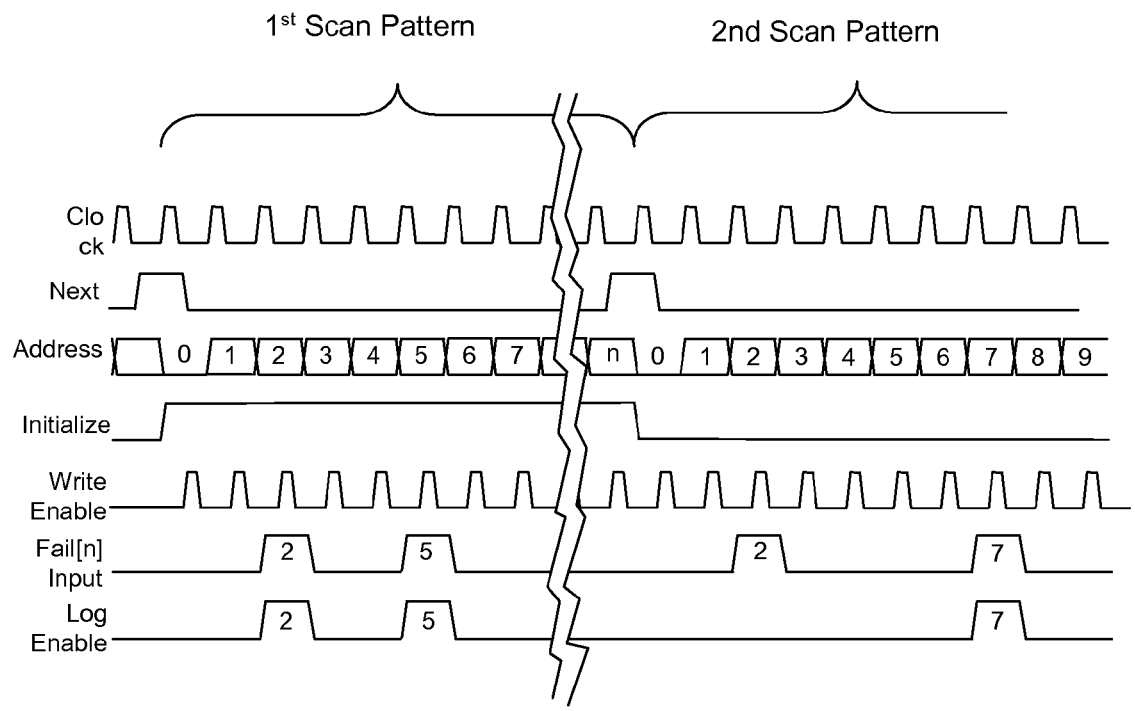
FIG. 5 is a timing diagram.
Figure 6:
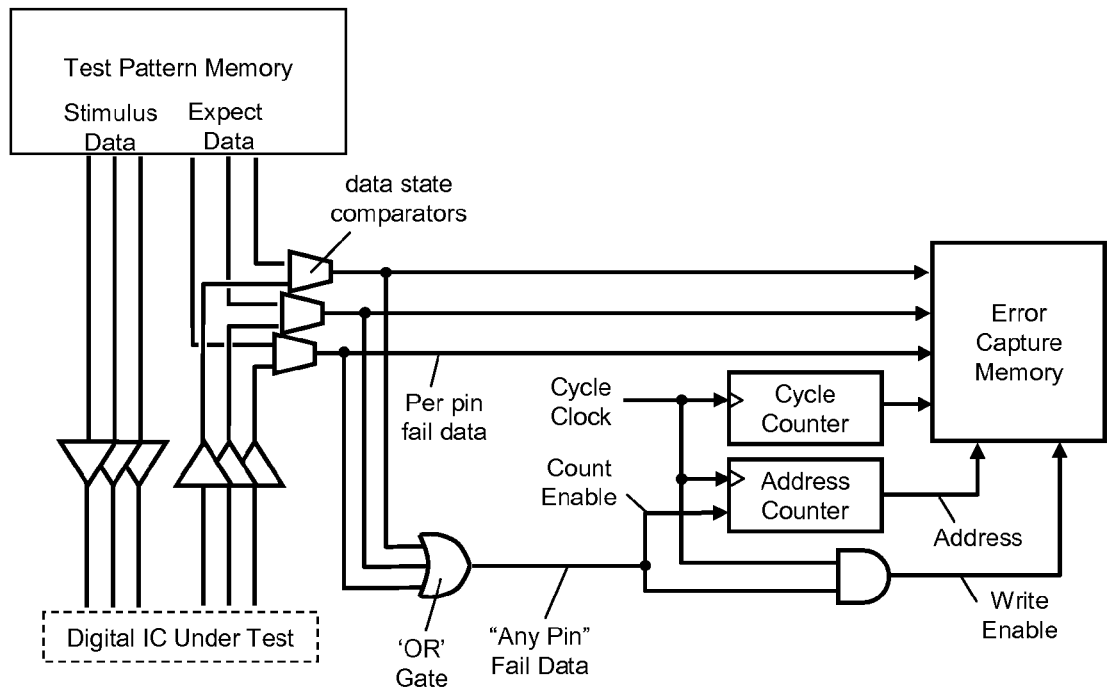
FIG. 6 is a schematic of a conventional tester.

The invention further comprises an input to the sequential failure mask store to load or initialize the contents as shown in FIG. 3 and set the size of the store. The invention further comprises an input to the sequential failure mask store to unload the contents as a cumulative failure scan out data stream as shown in FIG. 4.

The new failure filter of the invention comprises
means for receiving a sequential failure mask data stream,
means for synchronizing the data streams from the comparator and from the sequential failure mask store,
means for receiving a data state comparator data stream and means for transmitting a Fail data value when the data state comparator value is Fail and the failure mask data value is Unmask; and
means for transmitting a Pass data value in all other conditions.

The failure accumulator of the invention comprises means for receiving a first sequential failure mask data stream and means for receiving an error capture memory data stream and means for transmitting a second sequential failure mask data stream as follows:
Mask if error capture memory input value is Fail,
Mask if a first sequential failure mask data value is Mask, Unmask if error capture memory input value is Pass and first sequential failure mask data value is Unmask.

It may be appreciated by one skilled in the art of logic design that Pass, Fail, Mask, and Unmask may be encoded as various binary values or even multi-bit values without altering the principle of the invention. According to the technology chosen for embodiment, those skilled in the art may select available technologies to implement the failure accumulator and new failure filter. These include but are not limited to fpga's, pld's, look-up tables, logic gates, sea of gates, standard cells, and even discrete devices. One embodiment is a plurality of OR gates to accumulate failures into the failure mask store. Another embodiment is a plurality of AND gates to provide a new failure filter. A preferred embodiment is to employ parallel processing to support DUT's with a plurality of scan out ports, while conscious that a single OR gate and a single AND gate would suffice for a degenerate DUT with only one scan out port.

It may be appreciated by one skilled in the art of logic design that a sequential failure mask store may be implemented in many ways without altering the principle of the invention. A dual port memory may be used for simultaneous reading and writing. Two banks of memory may be alternately used for a first failure mask store and a second failure mask store. A delay line or shift register of length twice the scan chain may be employed. Video RAM, Static RAM, or Dynamic RAM or rotating memory may be employed without altering the principle of the invention.

Preferred Embodiment

An additional memory is added to the tester design that is a called the "Dynamic Mask Memory" or a Sequential Failure Mask Store. A control section is also added to interact with the memory and also to the other elements of the tester that provide failure detecting and recording. This memory is organized with addressable locations at least as large as the maximum scan chain length of a Device Under Test (DUT).

The memory address pointer is reset at the beginning of each individual scan chain pattern "unload" sequence and is advanced on each scan output vector. Thus on any cycle, the memory address represents the scan cell position in every scan chain which is received at the scan out.

Referring now to FIG. 9 which illustrates the invention for 3 bits of data but which is not a limitation on the principle of the invention, an embodiment of the invention is an apparatus for controlling error capture memory of a tester comprising:
  a gate coupled to a write enable control input of a error capture memory of a tester;
  a dynamic mask control logic circuit coupled to the gate; and
  a dynamic mask memory coupled to the dynamic mask control logic circuit; whereby
  error capture memory of a tester is write enabled only when a test pattern presented to the dynamic mask control logic circuit includes at least one scan cell failure not previously stored in the dynamic mask memory.

Referring now to FIG. 10, the dynamic mask control logic circuit is embodied as:
  logic means for detecting that test pattern fail data includes at least one bit not previously stored in dynamic mask memory as a first mask bit pattern;
  logic means for storing a second mask bit pattern into dynamic mask memory containing all previous and newly discovered failed bits in test pattern fail data; and
  logic means for enabling storage into error capture memory of a tester.

A first mode of the invention illustrated in FIG. 1 supports the intent to ignore failures detected in a previously determined set of specific flipflops that may or may not occur during the execution of a sequence of patterns. Also the "write" function to the dynamic mask memory shown in FIG. 10 is inhibited during the subsequent executions of the test pattern set thus maintaining a persistent contents of the memory as was preloaded by the tester CPU. Thus during the execution of the test pattern set, a "1" in the mask memory location will prevent the error for that associated flipflop from being recorded into the tester's failure capture memory, but all errors for flipflops that are not masked to be recorded.

A second mode illustrated in FIG. 2 where the mask memory is initially cleared and subsequently when a failure is detected on any scan chain output (scan out):
  If the mask memory content for that scan cell is an Unmask (in an embodiment "0"), the error is processed and the cycle and pin is recorded in the error capture memory as described before. Also a Mask (in an embodiment "1") is written into the mask memory.
  If the mask memory content for that scan cell is a Mask (in an embodiment "1"), the error is ignored, that is, not recorded the error capture memory.

Another mode of the invention illustrated in FIG. 3 is that the mask memory is preset when it has been previously been determined (by some other process) that a certain set of flipflops could cause errors but which it is the intent not to record these errors into the tester's data capture memory. In this mode the tester computer will preload the mask memory locations associated with the specific flipflop list to ignore with a "1" state, and all other mask memory locations set to a "0". "persistent" state and is used for masking any previously loaded flipflop mask states (e.g. by the tester CPU). In this mode an unmasked error is recorded into the error capture memory and the mask memory is updated.

CONCLUSION

The present invention addresses a common problem in conventional testers as follows: the process of transferring the error capture memory contents back to the tester CPU, and subsequently into a disc file for off-line analysis, is a time consuming task which can have a negative impact on throughput in a semiconductor manufacturing test environment. In extreme cases occurring when the quantity of test failures exceed the available error capture memory of a tester this causes both lengthy download times and reiteration of a test program. By adding an additional memory and circuits for dynamic masking, repeating failures are not rerecorded which substantially increases throughput of testing and logging data for post test analysis and reduces cost.

The scope of the invention includes all modification, design variations, combinations, and equivalents that would be apparent to persons skilled in the art, and the preceding description of the invention and its preferred embodiments is not to be construed as exclusive of such.

What is claimed is:

1. An apparatus comprising a sequential failure mask store coupled to a new failure filter, wherein the new failure filter receives a data stream emitted from a data state comparator and a failure mask data stream emitted from the sequential failure mask store wherein the failure mask data stream masks previously discovered failures in test pattern fail data and wherein the new failure filter transmits an error capture memory input data stream, the error capture memory input data stream providing an input to the sequential failure mask store.

2. An apparatus comprising a sequential failure mask store coupled to a new failure filter, wherein the new failure filter receives a data stream emitted from a data state comparator, and a first failure mask data stream emitted from the sequential failure mask store, wherein the first failure mask data stream masks previously discovered failures in test pattern fail data, and wherein the new failure filter transmits an error capture memory input data stream, the error capture memory input data stream providing an input to a failure accumulator, wherein the failure accumulator is coupled to the sequential failure mask store to i) receive from the sequential failure mask store the first failure mask data stream and ii) transmit to the sequential failure mask store a second failure mask data stream.

3. The apparatus of claim 2 further comprising an input to the sequential failure mask store to initialize the contents and set the size of the store.

4. The apparatus of claim 2 further comprising an input to the sequential failure mask store to unload the contents as a cumulative failure data stream.

5. The apparatus of claim 2 further comprising an input to the sequential failure mask store to load the contents with a saved failure mask data stream.

6. A new failure filter comprising means for receiving a sequential failure mask data stream that masks previously discovered failures in test pattern fail data, means for receiving a data state comparator data stream, means for synchronizing the sequential failure mask data stream and the data state comparator data stream, means for transmitting a Fail data value when a data state comparator value in the data state comparator data stream is Fail and a failure mask data value in the sequential failure mask data stream is unmasked, and means for transmitting a Pass data value for all other combinations of data state comparator values and failure mask data values.

7. A failure accumulator comprising means for receiving a first sequential failure mask data stream that masks previously discovered failures in test pattern fail data and means for receiving an error capture memory input data stream and means for transmitting a second sequential failure mask data stream as follows:
    Mask if an error capture memory input value is Fail,
    Mask if a first sequential failure mask data value is Mask,
    Unmask if an error capture memory input value is Pass and first sequential failure mask data value is Unmask.

\* \* \* \* \*